(12) United States Patent  
Lukashevich

(10) Patent No.: US 8,422,294 B2
(45) Date of Patent: Apr. 16, 2013

(54) SYMMETRIC, DIFFERENTIAL NONVOLATILE MEMORY CELL

(75) Inventor: Dzianis Lukashevich, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/232,278

(22) Filed: Sep. 14, 2011

(65) Prior Publication Data

US 2012/0087191 A1 Apr. 12, 2012

Related U.S. Application Data

(60) Provisional application No. 61/391,245, filed on Oct. 8, 2010.

(51) Int. Cl.
 *G11C 14/00* (2006.01)
 *G11C 16/04* (2006.01)
(52) U.S. Cl.
 USPC ............... 365/185.08; 365/185.07; 365/185.1
(58) Field of Classification Search ............... 365/185.08
 See application file for complete search history.

(56) References Cited

U.S. PATENT DOCUMENTS

| 5,453,949 | A | | 9/1995 | Wiedmann et al. |
| 5,566,110 | A | * | 10/1996 | Soenen et al. ............ 365/185.07 |
| 5,771,189 | A | | 6/1998 | Jun et al. |
| 5,892,709 | A | | 4/1999 | Parris et al. |
| 6,017,792 | A | | 1/2000 | Sharma et al. |
| 6,087,211 | A | | 7/2000 | Kalnitsky et al. |
| 6,330,190 | B1 | | 12/2001 | Wang et al. |
| 6,509,606 | B1 | | 1/2003 | Merrill et al. |
| 6,765,825 | B1 | * | 7/2004 | Scott ......................... 365/185.01 |
| 6,909,389 | B1 | | 6/2005 | Hyde et al. |
| 6,985,386 | B1 | | 1/2006 | Mirgorodski et al. |
| 7,288,811 | B2 | | 10/2007 | Tsunoda et al. |
| 7,471,570 | B2 | * | 12/2008 | Morton et al. ........... 365/185.28 |
| 7,570,257 | B2 | | 8/2009 | Ikeda |
| 7,691,702 | B2 | | 4/2010 | Kapoor |
| 2002/0008271 | A1 | | 1/2002 | Hsu et al. |

(Continued)

FOREIGN PATENT DOCUMENTS

WO 2009071965 A1 6/2009

OTHER PUBLICATIONS

U.S. Appl. No. 12/846,996, filed Jul. 30, 2010.
Dennis Walker, Jr., et al., "Characterization of Two Standard CMOS EEPROM Designs", IEEE 2001, Department of Electrical Engineering, The Ohio State University, p. 894-896.

(Continued)

*Primary Examiner* — Son Mai
(74) *Attorney, Agent, or Firm* — Eschweiler & Associates, LLC

(57) ABSTRACT

Some embodiments relate to a differential memory cell. The memory cell includes a first transistor having a source, a drain, a gate, and a body. A first capacitor has a first plate and a second plate, wherein the first plate is coupled to the gate of the first transistor and extends over the body region. The memory cell also includes a second transistor having a source, a drain, a gate, and a body, wherein the source and body of the second transistor is coupled to the second plate of the first capacitor. A second capacitor has a third plate and a fourth plate, wherein the third plate is coupled to the gate of the second transistor and the fourth plate is coupled to the source and the body of the first transistor.

14 Claims, 5 Drawing Sheets

U.S. PATENT DOCUMENTS

| | | |
|---|---|---|
| 2006/0033143 A1 | 2/2006 | Chen et al. |
| 2006/0216887 A1 | 9/2006 | Hsieh et al. |
| 2006/0262599 A1* | 11/2006 | Wu .......................... 365/185.05 |
| 2008/0001199 A1 | 1/2008 | Hoefler |
| 2008/0025109 A1 | 1/2008 | Lee |
| 2008/0186768 A1* | 8/2008 | Shin et al. ................ 365/185.07 |
| 2011/0103146 A1* | 5/2011 | Tailliet ..................... 365/185.09 |

OTHER PUBLICATIONS

Non-Final Office Action dated Sep. 14, 2012 for U.S. Appl. No. 12/846,996.

Notice of allowance dated Feb. 6, 2013 for U.S. Appl. No. 12/846,996.

* cited by examiner

SYMMETRIC, DIFFERENTIAL NONVOLATILE MEMORY CELL

BACKGROUND

This application is a Non-Provisional of U.S. Patent Application Ser. No. 61/391,245 filed Oct. 8, 2010 entitled "Symmetric, Differential Nonvolatile Memory Cell", the contents of which are herein incorporated by reference in their entirety.-

There are many different types of memory used to store data. One type of memory is Electrically Erasable Programmable Read-Only Memory (EEPROM), which is used in many electronic products (e.g., to store calibration and customer specific data for industrial and automotive sensors). EEPROM cells are said to be non-volatile, because the data contents remain there even if power is disconnected from the cells.

Even though EEPROM cells tend to be non-volatile, the charge stored in a given EEPROM cell can change as the cell is repeatedly programmed and/or erased, due to cell degradation. For example, FIG. 1 shows a threshold/read-out voltage, which corresponds to a charge stored in a number of memory cells, as the cells are programmed and erased (i.e., cycled, 1 cycle is 1× Program and 1× Erase) up to several thousand times. Some of the cells store a first data state (e.g., a "1" or "programmed" data state), which is defined by voltage threshold window 104. When read during cycling, the cells programmed to the first state provide a threshold voltage 102, which varies over the number of cell cycles. Other cells store a second data state (e.g., a "0" or "erased" data state), which is defined by voltage threshold window 108. When read during cycling, the cells erased to the second state provide a threshold voltage 106, which varies over the number of cell cycles.

Unfortunately, as can be seen from FIG. 1, the charges stored in the cells tend to "wander" as a function of the number of times the cells are programmed and erased or cycled. For instance, when cells are first accessed at time 110, individual cells' voltage thresholds 102, 106 reside well within the first and second voltage windows 104, 108, respectively. However, by the ten-thousandth cycle at 112, the charges stored in the cells will not be the same as at 110 due to cell degradation, causing some cells which were intended to be "erased" to have voltage thresholds 106 that fall outside of the second voltage threshold window 108. Further, in the illustrated example, at higher cycle counts, the threshold voltages 102 for programmed cells tends to increase (i.e., cells become programmed "more strongly" for higher cycle counts); but the threshold voltage 106 for erased cells tends to decrease (i.e., the cell becomes erased "more weakly" for higher-cycle counts). The ideal case would be if the voltage threshold curves 102, 106 remain constant in the middle of the voltage threshold windows 104, 108, respectively, but the case when curve 102 increases slightly and the curve 106 decreases slightly is acceptable, too.

Whatever the case, because cells are normally read by using a reference cell that does not take into account different levels of wander, a heavily-cycled memory cell can yield different data values from a "fresh" cell, even if both cells actually store the same data. For example, even if a lower data state (e.g., "0" data state) was written to a heavily-cycled cell, a read operation of the cell (which compares the voltage level correspondent to the charge stored in the access cell to a reference cell) may incorrectly determine that the cell stores an upper data state (e.g., "1" data state). The worst case appears if cell degradation causes both curves 102, 106 to become closer or even cross. In the latter case it is clearly no longer possible to make an accurate determination of whether a given cell is in a programmed or erased state.

Therefore, the inventors have devised techniques for making a memory cell more resistant to cell degradation, thereby helping to ensure reliable data storage.

DETAILED DESCRIPTION

Figure 1:
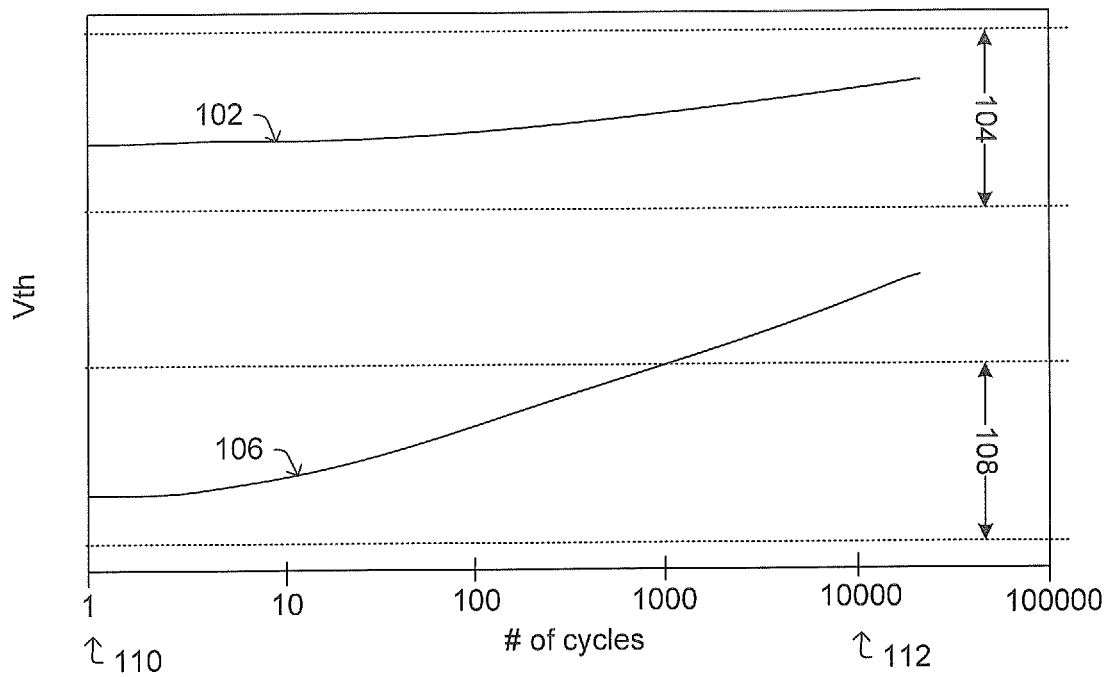
FIG. 1 shows a graphical plot of one manner in which voltage threshold levels of memory cells can wander as a function of the number of times the cells are cycled.

One or more implementations of the present invention will now be described with reference to the attached drawings, wherein like reference numerals are used to refer to like elements throughout. The drawings are not necessarily drawn to scale.

Figure 2:
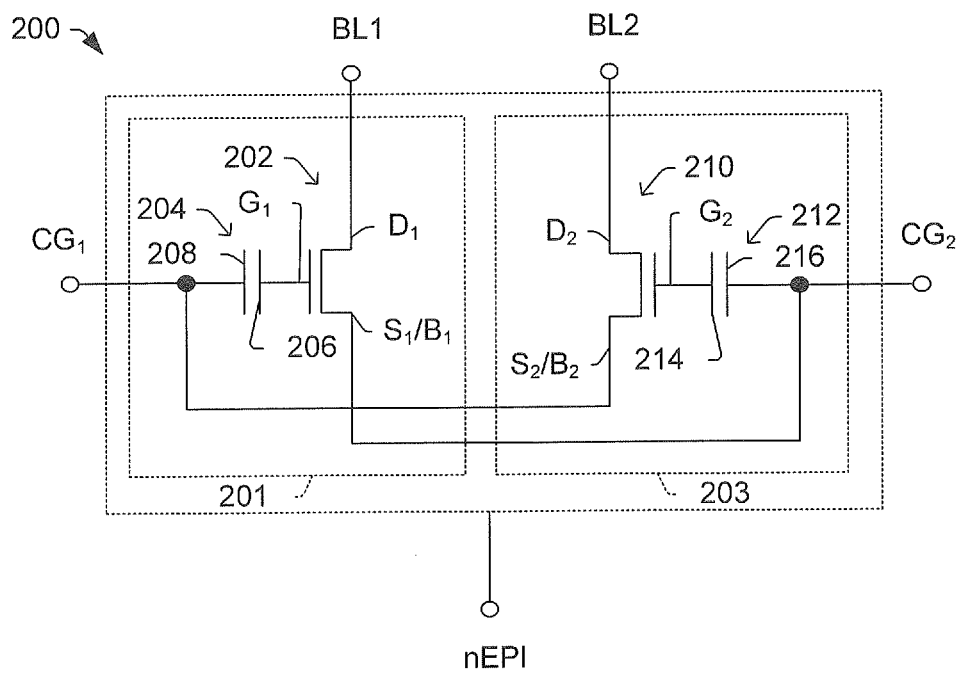
FIG. 2 shows a schematic view of a memory cell in accordance with some embodiments.

To limit the amount of "wander" of EEPROM cells, the inventors have developed symmetric, differential EEPROM cells, such as shown in FIG. 2 for example. FIG. 2's symmetric differential EEPROM cell 200 includes two EEPROM sub-cells (first sub-cell 201 and second sub-cell 203) lying in a common well or substrate (e.g., nEpi). The first and second sub-cells 201, 203 are differentially connected so if one sub-cell is programmed (e.g., to have margin voltage $V_1$), then the other sub-cell is simultaneously erased (e.g., to have margin voltage $V_0$). Similarly, if one sub-cell is erased (e.g., to have the margin voltage $V_0$), then the other is simultaneously programmed (e.g., to have the margin voltage $V_1$). Whereas a conventional EEPROM cell is read by comparing the cell's output voltage threshold to a reference voltage (which is used for read voltage threshold comparisons for multiple cells), the symmetric differential cell 200 is read simply by measuring the difference voltage $\Delta V = V_1 - V_0$ and phase between the first and second sub-cells 201, 203. Thus, the differential cell 200 limits or completely eliminates the need for an external reference cell.

The cell 200 is called differential because a charge difference is stored and a difference margin voltage $\Delta V$ is read, and the cell is called symmetric because both sub-cells 201, 203, have the same symmetric coupling factors during programming/erasing modes. These symmetric, differential cells can limit cell "wander" effect (as previously shown to be a problem in FIG. 1 for conventional cells reading), because small $\Delta V$ between the two sub-cells can be detected even after a significant number of cycles are carried out (e.g., Δ between 102 and 106 after 100,000 cycles). As can be appreciated from FIG. 1, even if the voltage thresholds of the individual sub-cells "wanders" over time, the $\Delta V$ measured between the sub-cells 201, 203 can still give a correct read value over a large number of cycles. In addition, compared to conventional EEPROM cells, the symmetric differential cell 200 is less sensitive to technological (e.g., manufacturing) variations.

This is because the two sub-cells 201, 203 forming the differential cell 200 are designed to be identical and are placed close together on the die.

More particularly, FIG. 2 shows a schematic representation of a symmetric differential EERPOM memory cell 200. The first sub-cell 201 includes a first transistor 202 having a source S1, a drain D1, and a gate G1; as well as a first capacitor 204 having a first plate 206 and a second plate 208. The first plate 206 is coupled to the gate G1 of the first transistor 202. The first transistor 202 is formed in a well region 201 (e.g., a p-well), which may also be called body1 (B1).

The second sub-cell 203 includes a second transistor 210 having a source S2, a drain D2, and agate G2, wherein the source 82 is coupled to the second plate 208 of the first capacitor 204. In addition, the memory cell 200 includes a second capacitor 212 having a third plate 214 and a fourth plate 216, wherein the third plate 214 is coupled to the gate G2 and the fourth plate 216 is coupled to the source S1 of the first transistor. The second transistor 210 is formed in a well region 203 (e.g., a p-well), which may also be called body2 (B2).

Often the bodies B1, B2 of the first and second transistors, respectively, are diode tied to the sources of their respective transistors. Both the first and second bodies 201, and 203 are disposed on the same substrate, common well, or EPI layer (e.g., nEPI).

A first data state (e.g., a logical "1") can be written to the cell 200 by applying a first differential voltage over the control gates CG1, CG2. A second data state (e.g., a logical "0") can be written to the cell 200 by applying a second, different differential voltage over the control gates CG1, CG2. Often, to limit the amount of circuitry required, the first differential voltage is equal in magnitude to the second differential voltage, albeit with the polarity reversed.

One example of voltage conditions to write data to and read data from the memory cell 200 is shown in Table 1 below:

TABLE 1

Read/Write Voltage conditions for memory cell

| Device Pin | Modes and Operating Voltages | | |
|---|---|---|---|
| | Write mode - Program "1" | Write mode - Erase "0" | Read mode |
| CG1 | 21 V | 0 V | 0 V (or VCGread) |
| CG2 | 0 V | 21 V | 0 V (or VCGread) |
| BL1 | Floating | Floating | Vread/Iread |
| BL2 | Floating | Floating | Vread/Iread |
| nEPI | 21 V | 21 V | 0 V |

Thus, in Table 1's example, to write a logical "1" to the memory cell, about 21 volts is applied to CG1 and about 0 volts is concurrently applied to CG2. To write a logical "0" to the memory cell, about 0 volts is applied to CG1 and about 21 volts is concurrently applied to CG2. By switching between these bias conditions, control circuitry can selectively write desired data values to individual memory cells (or to a block of memory cells, depending on the architecture of a memory array in which the memory cell is deployed). It will be appreciated that all voltages are approximate and that ranges of these voltages can vary widely depending on the technology used. For example, the voltage levels could vary depending on the feature sizes of the semiconductor devices in the memory cell, the doping concentrations associated with the semiconductor devices, and many other factors. Also, in other embodiments, the voltage conditions associated with a logical "1" and a logical "0" could be reversed, depending on the convention used. Multi-level data schemes representing more than two bits of data could also be used.

Because the memory cell 200 provides a differential voltage or current at the cell's output, the likelihood of data corruption is significantly reduced relative to conventional memory cells.

Figure 3:
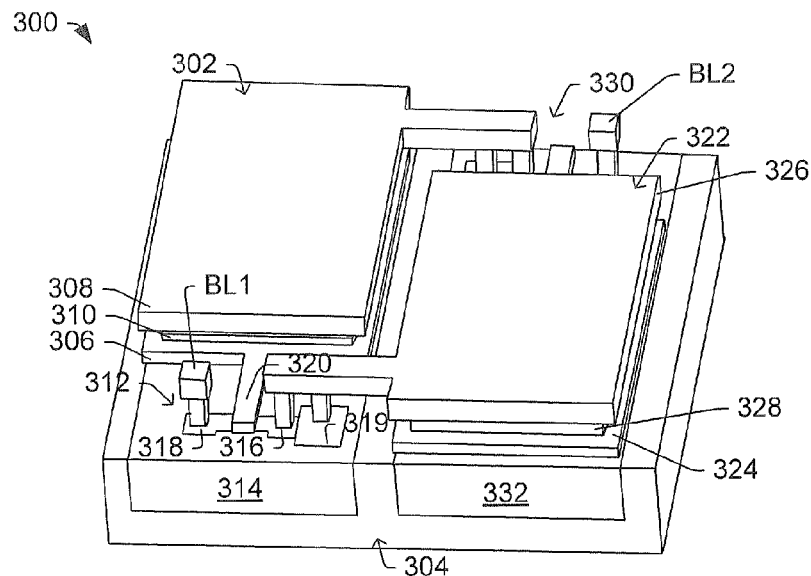
FIG. 3 shows a perspective view of a memory cell in accordance with one embodiment.
Figure 4:
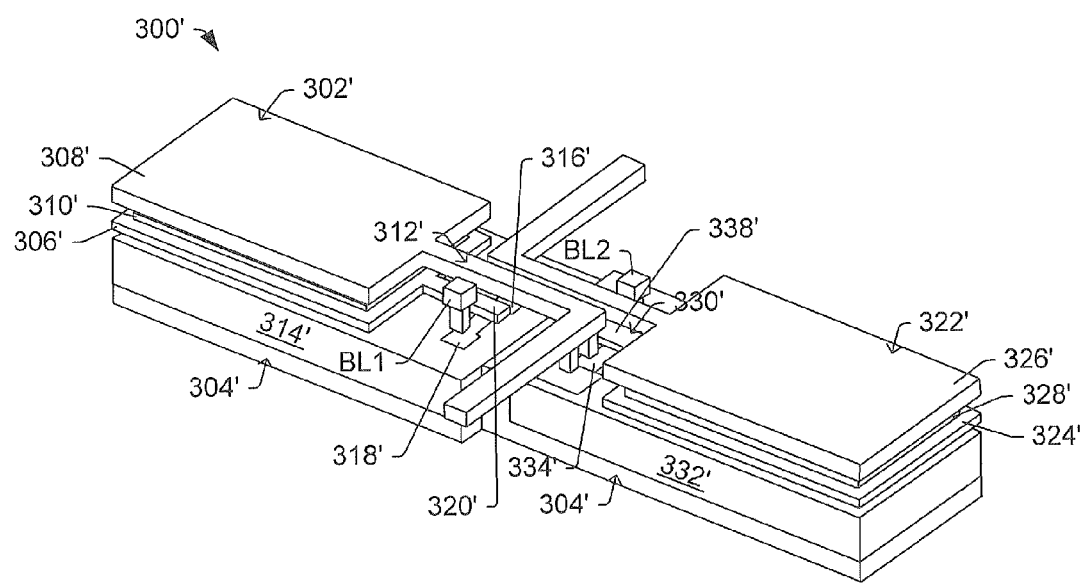
FIG. 4 shows a perspective view of a memory cell in accordance with one embodiment.

FIG. 3 shows a perspective view of a layout of a memory cell 300 consistent with FIG. 2's schematic representation. FIG. 4 shows a perspective view of an alternative layout 300' that is also consistent with FIG. 2's schematic representation. Because FIG. 3 and FIG. 4 follow the same schematic representation (e.g., the same as FIG. 2), FIG. 4 uses the same reference numerals as FIG. 3, albeit that corresponding elements in FIG. 4 are followed by a tick-mark/apostrophe ('). For example, FIG. 3 includes a first capacitor 302 and a first transistor 312, while FIG. 4 includes a first capacitor 302' and a first transistor 312'.

In these layouts, a first capacitor 302 is formed over a first portion of a semiconductor substrate 304 (e.g., nEPI) and over a first well/body 314 (e.g., p-well). The first capacitor 302 includes a first conductive plate 306 and a second conductive plate 308, wherein an insulating layer 310 is disposed between the first and second plates. In some embodiments, the first and second conductive plates 306, 308 are made of poly-silicon, although one or both of the plates could also be made out of another conductive material, such as metal, for example. In addition, in some embodiments the insulating layer 310 includes a nitride layer sandwiched between a first oxide layer and a second oxide layer. In other embodiments, the insulating layer 310 can comprise only a single oxide layer, or can include these or other insulating materials.

A first transistor 312 is formed over a second portion of the semiconductor substrate 304 and over the first well 314. The first transistor 312 includes a source region 316 and a drain region 318, which are separated from one another via a channel region under the floating gate 320. The source 316 is coupled to a fourth capacitor plate 326. An insulating layer, which is often referred to as a gate oxide or tunnel oxide, is sandwiched between the floating gate 320 and the transistor channel and electrically isolates the channel region from the floating gate. A well contact 319 of the first well 314 (e.g., body contact of transistor 312) is also included to allow suitable potential under the plate 306 and, therefore, to ensure the same coupling factor while programming and erasing.

The source 316 and drain 318 of the first transistor are formed in the first well 314 and the plates of the first capacitor 302 often extend over the first well 314. By including the first transistor 312 in the first well 314 and by having the first capacitor extend over the first well, some embodiments help to ensure a symmetric coupling factor during programming/erasing. Further, the first well 314 and a second well 332 are formed in substrate or common well 304 (e.g., nEPI).

A second capacitor 322 is formed over a third portion of the semiconductor substrate 304 and over a second well 332 (e.g., p-well). The second capacitor 322 includes a third conductive plate 324 and a fourth conductive plate 326, wherein an insulating layer 328 is disposed between the third and fourth plates. In some embodiments, the third and fourth conductive plates 324, 326 are made of poly-silicon, although one or both of the plates could also be made out of another conductive material, such as metal, for example. In addition, in some embodiments the insulating layer 328 includes a nitride layer sandwiched between a first oxide layer and a second oxide layer. In other embodiments, the insulating layer 328 can comprise only a single oxide layer, or can include these or other insulating materials.

A second transistor 330 is formed over a fourth portion of the semiconductor substrate 304 and over the second well 332. The second transistor 330 includes a source region 334' and a drain region (not viewable), which are separated from one another via a channel region under the floating gate 338'. An insulating layer, which is often referred to as a gate oxide or tunnel oxide, electrically isolates the channel region from the floating gate. A well contact of the second well (e.g., body contact of transistor 330) is also included to allow suitable potential under the plate 324 and, therefore, to ensure the same coupling factor while programming and erasing.

Although FIGS. 2-4 show examples of EEPROM memory cells (300, 300'), alterations and/or modifications may be made to the illustrated examples without departing from the spirit and scope of the appended claims. For example, in some implementations the EEPROM memory cell 300 can have an n-type substrate 304 (e.g., nEPI), p-type well regions 314 and 332, and n-type source and drain (e.g., 316/318); however, in other embodiments these doping conventions could be reversed. For example, the substrate 304 could be p-type (e.g., pEPI), the well regions 314 and 332 could be n-type (e.g, n-wells), and the sources and drains 316/318 could be p-type.

Figure 5:
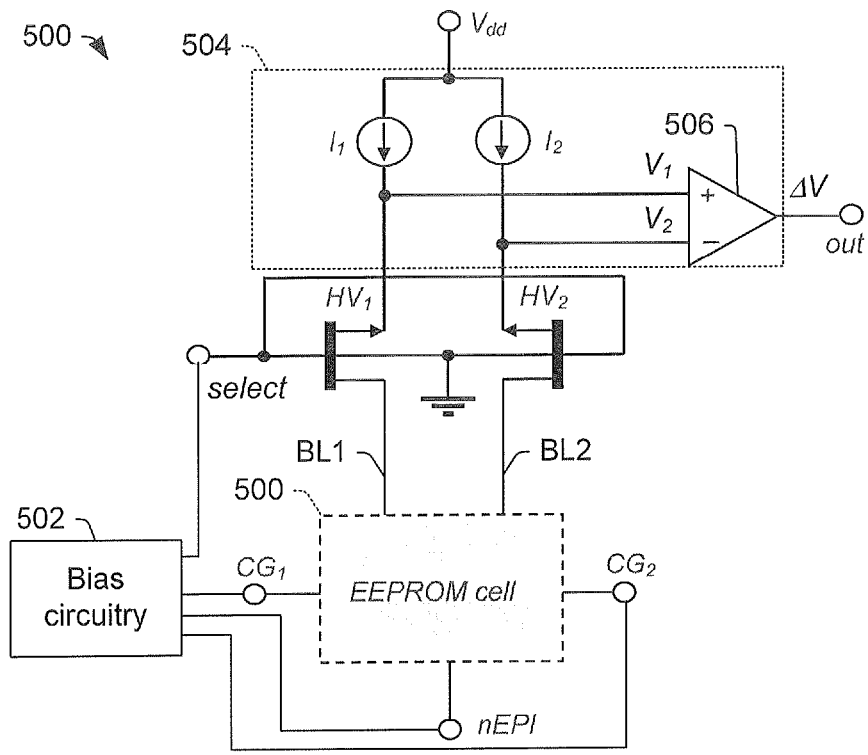
FIGS. 5-7 show possible application circuits to read data from and/or write data to a memory cell.
Figure 6:
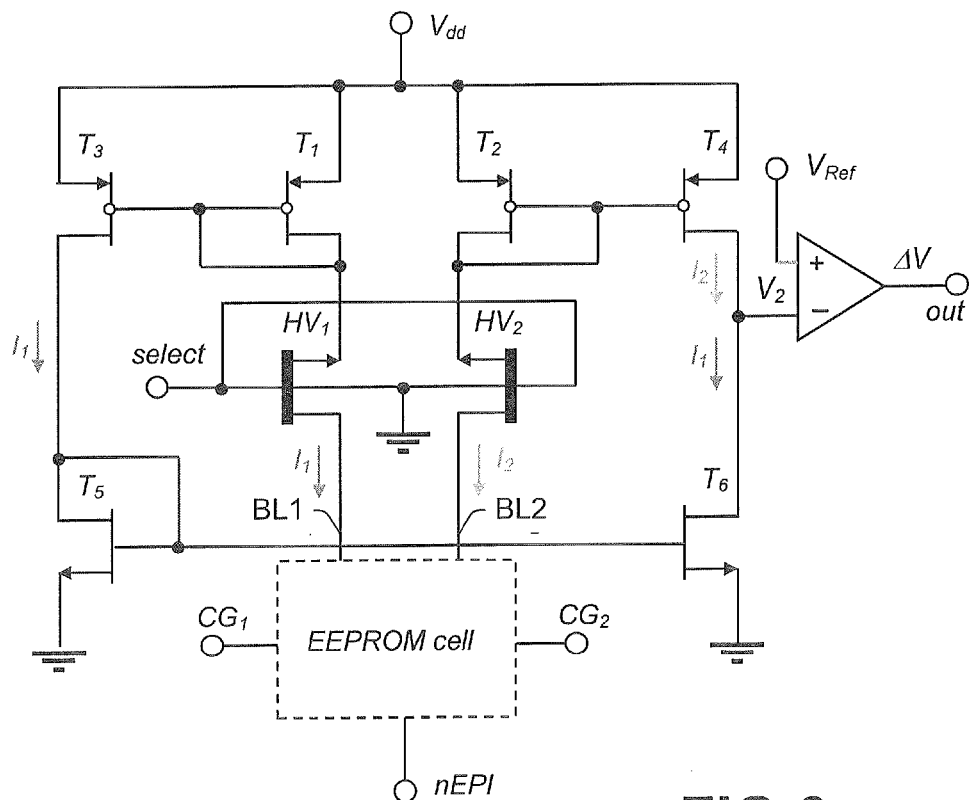
Figure 7:
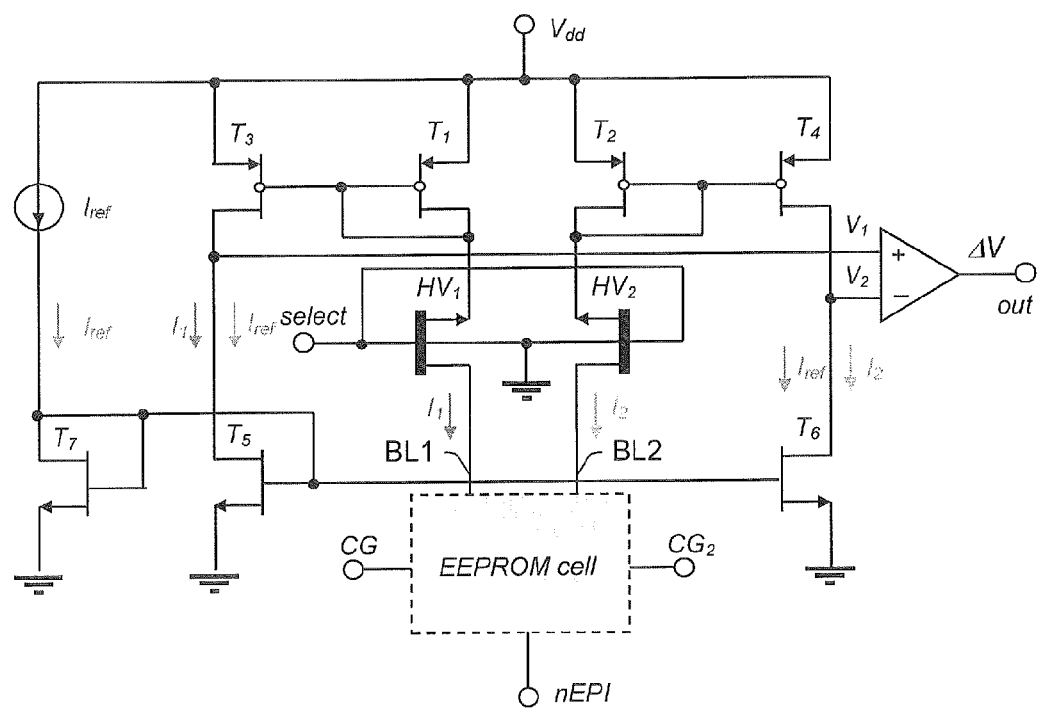

FIGS. 5-7 show various examples of control circuitry to read and/or write data states to and from a differential, symmetric memory cell 500 (e.g., memory cell 200 of FIG. 2). To write data to the memory cell 500, biasing circuitry 502 of FIG. 5 can program/erase the memory cell via pins $CG_1$, $CG_2$, select, and nEPI, for example according to Table 2 below. As with Table 1, all voltages in Table 2 are approximate and actual voltages can vary widely depending on a number of factors.

TABLE 2

| | Modes and Operating Voltages | | |
|---|---|---|---|
| Device Pin | Program "1" | Erase "0" | Readout |
| $CG_1$ | 21 V | 0 V | 0 V (or $V_{CGread}$) |
| $CG_2$ | 0 V | 21 V | 0 V (or $V_{CGread}$) |
| Select | 0 | 0 | 1.6 V-2.5 V (or $V_{select}$) |
| $V_{dd}$ | 2.5 V (or other supply voltage $V_{dd}$) | 2.5 V (or other supply voltage $V_{dd}$) | 2.5 V (or other supply voltage $V_{dd}$) |
| nEPI | 21 V | 21 V | 0 V |

To read data from the memory cell 500, the select pin is asserted to couple first and second bitlines BL1, BL2 to high voltage devices $HV_1$ and $HV_2$, which protect readout circuitry 504 from high programming/erasing voltages during programming/erasing. In one embodiment, the high-voltage devices HV1 and HV2 are HV-NMOS transistors, although they could be other type of transistors in other embodiments. A read operation of the cell 500 occurs by applying separate current sources $I_1$ and $I_2$ to the bitlines BL1, BL2 while $HV_1$ and $HV_2$ are open and driven in a so-called reverse mode (e.g., wherein the sources of HV1 and HV2 have a higher potential than the corresponding drains). These currents $I_1$ and $I_2$ induce voltages $V_1$ and $V_2$, respectively. A comparator 506 compares these voltages (e.g., $\Delta V = V_1 - V_2$) and delivers an output voltage indicative of whether the cell 500 is in a programmed or erased state. For example, a programmed state can be indicated by $\Delta V > 0V$, and in an erased state can be indicated by $\Delta V < 0V$. The readout conditions can be additionally adjusted by a voltage on the control gates if necessary.

FIG. 6 shows another embodiment of a programming and erasing circuit. In this example, a read operation occurs by applying a constant voltage source $V_{dd}$ to the current mirrors formed by PMOS transistors $T_1$ and $T_3$ for the first cell and $T_2$ and $T_4$ for the second cell, respectively. The currents $I_1$ and $I_2$ flowing through the single cells are dependent on the floating gate charges of both single EEPROM cells and induce correspondent voltage $V_1$ and $V_2$ which are checked with an external voltage $V_{ref}$ by a comparator. The transistors T5 and T6 are utilized as diodes conducting the same or mirrored currents $I_1$ and $I_2$.

The circuit in FIG. 6 can be improved by using an additional reference current source $I_{ref}$, for example as shown in FIG. 7. $V_{ref}$ and $I_{ref}$ can be chosen with regard to product specifications.

Figure 8:
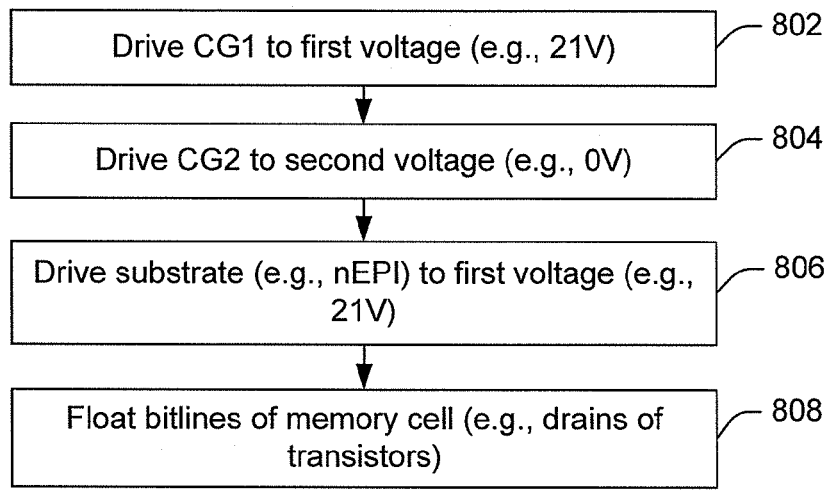
FIGS. 8-9 illustrate methods of writing a 1 value and 0 value, respectively, to a memory cell in accordance with some embodiments.
Figure 9:
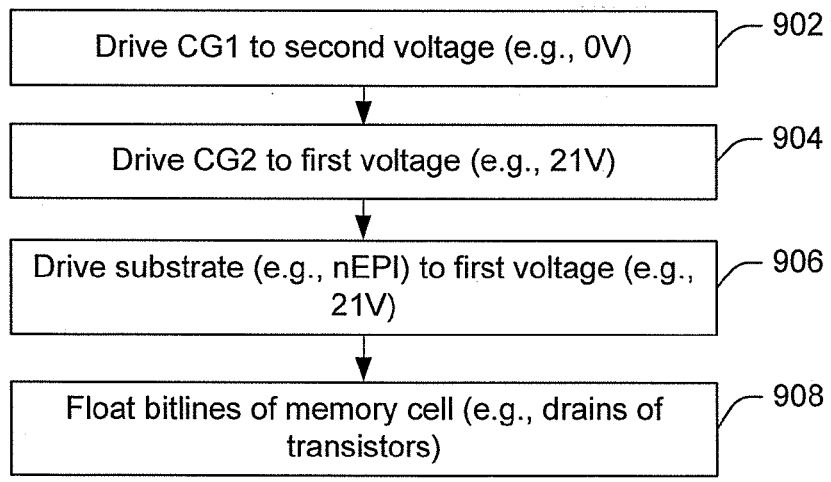

FIGS. 8-9 illustrate methods of writing a "1" value and "0" value, respectively, to a memory cell in accordance with some embodiments. Although these methods are illustrated in flow chart format, it will be appreciated that these and other methods disclosed herein are not limited to those illustrated. For example, steps of the methods may be carried out in different orders from those illustrated, and in some implementations the steps may be performed concurrently or simultaneously. These methods may be carried out on the previously disclose memory devices (e.g., memory cell 200 of FIG. 2, or memory cells 300/300' of FIG. 3/FIG. 4.)

FIG. 8 shows an example method of writing a "1" value to a memory cell. In some implementations, this may be synonymous with a "program" operation. At 802, a control gate of a first sub-cell (e.g., 201 in FIG. 2) is driven to a first (or higher) voltage. At 804, a control gate of a second sub-cell (e.g., 203 in FIG. 2) is simultaneously driven to a second (or lower), different voltage. At 806, the substrate (e.g., nEPI) is driven to the first (or higher) voltage. At 808, the bitlines of the memory cell are floated. In this manner, a "1" value can be written to the memory cell.

FIG. 9 shows an example method of writing a "0" value to the memory cell. In some implementations, this may be synonymous with an "erase" operation. At 902, the control gate of the first sub-cell (e.g., 201 in FIG. 2) is simultaneously driven to the second (or lower) voltage. At 904, the control gate of the second sub-cell (e.g., 203 in FIG. 2) is driven to the first voltage. At 906, the substrate (e.g., nEPI) is driven to the first (or higher) voltage. At 908, the bitlines of the memory cell are floated. In this manner, a "0" value can be written to the memory cell.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory cell, comprising:
a first transistor having a source, a drain, and a gate;
a first capacitor having a first plate and a second plate, wherein the first plate is coupled to the gate of the first transistor;
a second transistor having a source, a drain, and a gate, wherein the source of the second transistor is coupled to the second plate of the first capacitor; and
a second capacitor having a third plate and a fourth plate and having approximately the same area as the first capacitor, wherein the third plate is coupled to the gate of the second transistor and the fourth plate is coupled to the source of the first transistor.

2. The memory cell of claim 1, wherein the source and drain of the first transistor are formed in a first well region called a first body, and wherein the first capacitor extends over the first well region.

3. The memory cell of claim 2, wherein the source and drain of the second transistor are formed in a second well region called a second body, and wherein the second capacitor extends over the second well region.

4. The memory cell of claim 3, wherein the first and second well regions are formed in the same common well or substrate.

5. The memory cell of claim 4, wherein the same common well or substrate is an epitaxial layer.

6. The memory cell of claim 1, further comprising:
a first bitline coupled to the drain of the first transistor; and
a second bitline coupled to the drain of the second transistor;
wherein the first and second bitlines are operable to cooperatively carry a differential current or a differential voltage from the memory cell, the differential current or differential voltage indicative of a data value stored in the memory cell.

7. The memory cell of claim 1:
wherein a body of the first transistor is coupled to the source of the first transistor; and
wherein a body of the second transistor is coupled to the source of the second transistor.

8. The memory cell of claim 1, further comprising:
control circuitry to write a first data state to the memory cell by applying a differential voltage across control terminals associated with the second and fourth capacitor plates, wherein the second capacitor plate is at a higher voltage than the fourth capacitor plate during application of the differential voltage to write the first data state.

9. The memory cell of claim 8, wherein the control circuitry can write a second data state to the memory cell by applying the differential voltage across the control terminals associated with the second and fourth capacitor plates, wherein the second capacitor plate is at a lower voltage than the fourth capacitor plate during application of the differential voltage to write the second data state.

10. The memory cell of claim 3, wherein the first and second capacitors are formed over the first and the second well regions, respectively, and each capacitor comprises a pair of conductive plates having an insulating layer there between.

11. A method of accessing a memory cell, wherein the memory cell includes: a first transistor having a source, a drain, and a gate; a first capacitor having a first plate and a second plate, wherein the first plate is coupled to the gate of the first transistor; a second transistor having a source, a drain, and a gate, wherein the source of the second transistor is coupled to the second plate of the first capacitor; and a second capacitor having a third plate and a fourth plate, wherein the third plate is coupled to the gate of the second transistor and the fourth plate is coupled to the source of the first transistor:
wherein writing a first data state to the memory cell comprises:
driving the second capacitor plate to approximately a first voltage;
driving the fourth capacitor plate to approximately a second voltage while the second capacitor plate is driven to approximately the first voltage, wherein the second voltage is different from the first voltage.

12. The method of claim 11, wherein writing a second data state to the memory cell comprises:
driving the second capacitor plate to approximately the second voltage;
driving the fourth capacitor plate to approximately the first voltage while the second capacitor plate is driven to approximately the second voltage.

13. The method of claim 12, wherein the source and drain of the first transistor are disposed in a first well called a first body and wherein the first capacitor is disposed over the first well, and wherein the source and drain of the second transistor are disposed in a second well called a second body and wherein the second capacitor is disposed over the second well.

14. The method of claim 13 where the first and second bodies are disposed on a common substrate and wherein the common substrate is set to approximately the first or second voltages while the first and the second states are written to the memory cell.

* * * * *